United States Patent
Ito

(10) Patent No.: US 12,152,410 B2
(45) Date of Patent: Nov. 26, 2024

(54) SAFETY SWITCH AND STORAGE CONTROL METHOD

(71) Applicant: Panasonic Intellectual Property Management Co., Ltd., Osaka (JP)

(72) Inventor: Koji Ito, Gifu (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 729 days.

(21) Appl. No.: 17/207,003

(22) Filed: Mar. 19, 2021

(65) Prior Publication Data

US 2021/0332612 A1 Oct. 28, 2021

(30) Foreign Application Priority Data

Apr. 24, 2020 (JP) .................................. 2020-077801

(51) Int. Cl.
*E05B 47/06* (2006.01)
*E05B 41/00* (2006.01)

(52) U.S. Cl.
CPC .......... *E05B 47/0603* (2013.01); *E05B 41/00* (2013.01)

(58) Field of Classification Search
None
See application file for complete search history.

(56) References Cited

U.S. PATENT DOCUMENTS

| 6,008,722 | A | 12/1999 | Hirozawa et al. |
| 6,409,083 | B1 | 6/2002 | Link |
| 2016/0302289 | A1 | 10/2016 | Nishioka et al. |
| 2016/0311285 | A1* | 10/2016 | Plettner ................ B60G 17/017 |
| 2018/0187834 | A1 | 7/2018 | Phay et al. |
| 2019/0316405 | A1 | 10/2019 | Kashima et al. |

FOREIGN PATENT DOCUMENTS

| CN | 106061050 A | 10/2016 |
| DE | 10-2018-121445 A1 | 3/2020 |
| JP | H08-40207 A | 2/1996 |
| JP | 2019-085793 A | 6/2019 |
| JP | 2019-183542 A | 10/2019 |

OTHER PUBLICATIONS

Extended European Search Report dated Sep. 16, 2021 issued in Patent Application No. 21 164 582.5.

* cited by examiner

*Primary Examiner* — Suezu Ellis
(74) *Attorney, Agent, or Firm* — Pearne & Gordon LLP

(57) ABSTRACT

A safety switch includes a sensor body. The sensor body includes: a setting unit configured to set an operation mode of the safety switch; a detection unit configured to detect an actuator; a storage unit; and a control unit configured to control storage operation of the storage unit for identification information of the actuator. In response to satisfaction of conditions where: the operation mode is set by the setting unit to a pairing mode for associating the sensor body and the actuator with each other; the identification information of the actuator is not stored in the storage unit; and a first actuator is detected by the detection unit, the control unit allows the detection unit to acquire identification information of the first actuator and the storage unit to store the identification information.

3 Claims, 5 Drawing Sheets

SAFETY SWITCH AND STORAGE CONTROL METHOD

CROSS-REFERENCE TO RELATED APPLICATIONS

This application claims the benefit of priority of Japanese Patent Application No. 2020-077801 filed on Apr. 24, 2020, the entire contents of which are incorporated herein by reference.

FIELD

The present disclosure relates to a safety switch and a storage control method.

BACKGROUND

In a related art, a safety switch is mounted on a front door of a machine tool and a door portion of a safety fence around a periphery of an industrial robot, and the safety switch detects opening and closing of the door. In the safety switch, a dedicated actuator mounted on the door (a movable side) is inserted into a safety switch body by closing the door, and a contact point inside the body is switched to transmit a signal. As one of the safety switches, there is a safety switch including: a housing that supplies power to a wireless tag provided on an actuator; a wireless circuit for receiving a signal transmitted from the wireless tag; and a plurality of indicator lamps (refer to JP-A-2019-183542).

SUMMARY

In a safety switch of a related art, a safety switch body (a sensor body) and an actuator can be associated (paired) with each other on a one-to-one basis. There is room for improvement in a method for setting the association between the sensor body and the actuator. For example, it is desirable to be able to prevent deterioration in reliability of the safety switch while simplifying an initial association between the sensor body and the actuator.

The present disclosure provides a safety switch and a storage control method capable of preventing deterioration in reliability of the safety switch while simplifying an initial association between a sensor body and an actuator.

The present disclosure provides a safety switch including: a sensor body, wherein the sensor body includes: a setting unit configured to set an operation mode of the safety switch; a detection unit configured to detect an actuator; a storage unit; and a control unit configured to control storage operation of the storage unit for identification information of the actuator, and wherein in response to satisfaction of conditions where: the operation mode is set by the setting unit to a pairing mode for associating the sensor body and the actuator with each other; the identification information of the actuator is not stored in the storage unit; and a first actuator is detected by the detection unit, the control unit allows the detection unit to acquire identification information of the first actuator and the storage unit to store the identification information.

The present disclosure provides a A storage control method for allowing a sensor body of a safety switch and an actuator in association with each other, the storage control method including: setting an operation mode of the safety switch; and acquiring by the sensor body identification information of a first actuator and storing the identification information of the first actuator in response to satisfaction of conditions where: a pairing mode for associating the sensor body of the safety switch and the actuator with each other is set; identification information of the actuator is not stored in the sensor body; and the first actuator is detected by the sensor body.

According to the present disclosure, it is possible to prevent deterioration in reliability of a safety switch while simplifying an initial association between a sensor body and an actuator.

DETAILED DESCRIPTION

Figure 1:
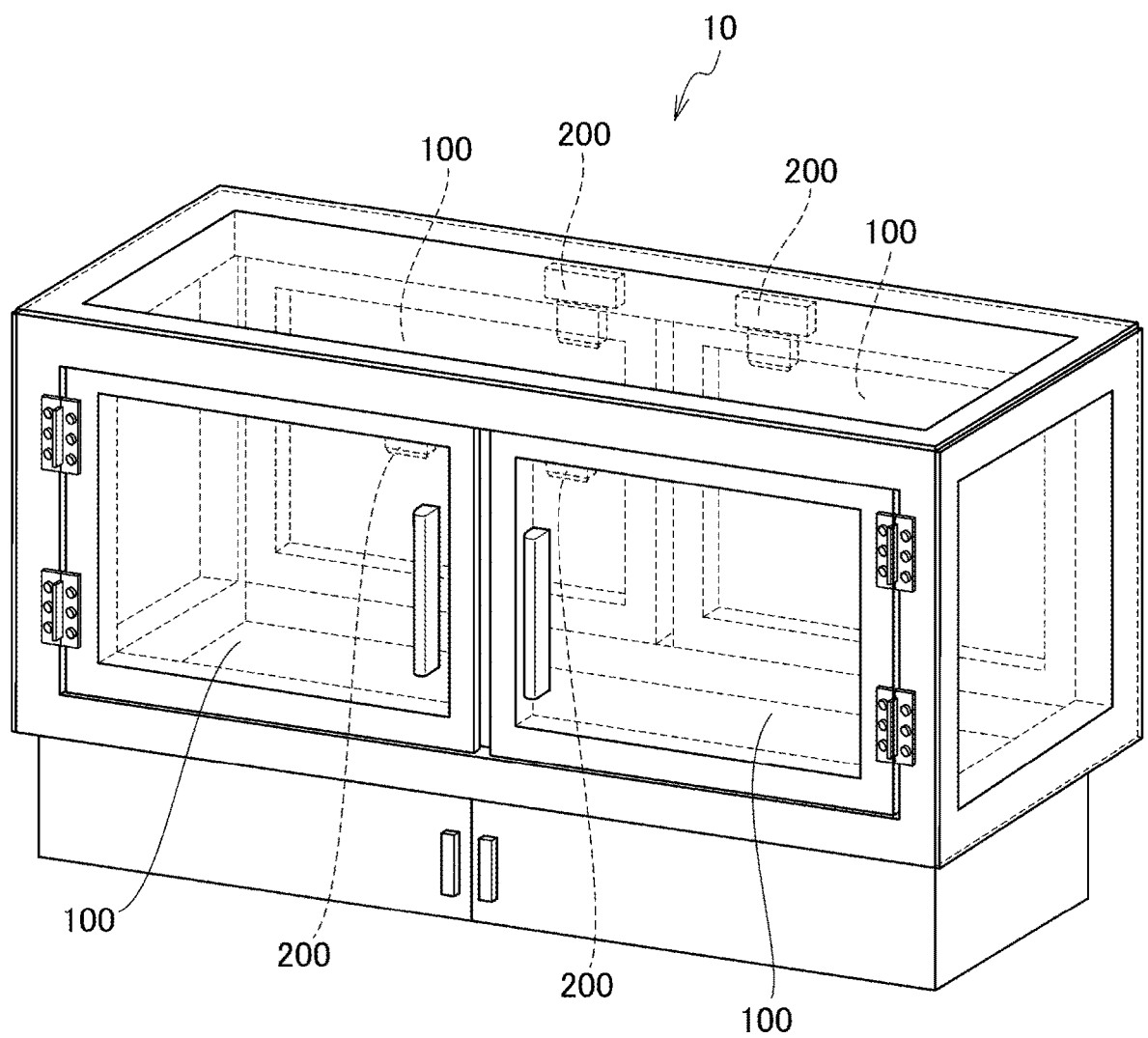
FIG. 1 is a diagram illustrating a configuration example of a device with a door according to an embodiment.

Hereinafter, embodiments will be described in detail with reference to the appropriate drawings. However, a detailed description more than necessary may be omitted. For example, a detailed description of an already well-known matter and a duplicate description of substantially the same configuration may be omitted. It is to avoid unnecessary redundancy of the following description and to facilitate the understanding of those skilled in the art. The accompanying drawings and the following descriptions are provided for those skilled in the art to fully understand the present disclosure, and are not intended to limit the subject matter described in the scope of the claims.

INTRODUCTION TO CONTENTS OF EMBODIMENTS

In a pairing process in which a sensor body of a safety switch and an actuator thereof are associated (paired) with each other, one-to-one pairing of the sensor body and the actuator is set. When the pairing is set, the sensor body detects that there exists abnormality even when detecting another actuator other than the paired actuator. As a result, the safety switch can prevent a situation in which the actuator is fraudulently used, and a situation in which a detection result of the presence of abnormality by the safety switch is fraudulently released.

The safety switch is manufactured in a factory or the like. For example, the pairing process is already performed at the time of shipment from the factory. The pairing process at an initial stage performed in such a factory or the like is also referred to as an "initial setting process".

The pairing process can also be performed by a user who actually uses the safety switch. For example, when either one of the sensor body and the actuator of the safety switch fails, only one of the sensor body and the actuator of the safety switch may be replaced. For example, when the actuator fails, the user who uses the safety switch receives another actuator that is not paired, and instructs execution of the pairing process between the sensor body already installed and the received another actuator at a base of the user. The above-described pairing process to be performed when either one of the sensor body and the actuator is replaced is also referred to as a resetting process.

Since the pairing process is performed for the purpose of preventing fraudulent use, a procedure of the pairing process is complicated. For example, in the resetting process, either one of the sensor body and the actuator once paired is paired with another sensor body or another actuator. Therefore, for example, the pairing is configured to be changed through a complicated procedure so that even though a malicious third party leads the resetting process, the pairing cannot be easily changed.

On the other hand, at a stage where the initial setting process is performed in the factory or the like, both the sensor body and the actuator are not set to be paired. A possibility that there exists a person who intends to perform fraudulent use in the factory is low. Therefore, necessity to perform the initial setting process required to perform a complicated procedure is low as compared with the resetting process. Here as well, reliability of the setting of the pairing does not deteriorate so much, and therefore it is considered that reliability of the safety switch does not deteriorate so much.

The following embodiments will describe a safety switch and a storage control method capable of preventing deterioration in reliability of the safety switch while simplifying an initial association procedure of a sensor body and an actuator.

Embodiment

FIG. 1 is a diagram illustrating a configuration example of a device with a door 10 according to the embodiment. The device with the door 10 includes one or more doors 100 and one or more safety switches 200. The door 100 may broadly include a door-related object such as a door or the like, and may include a window. One or more devices (for example, a manufacturing device and other devices) are housed inside the device with the door 10. The device disposed inside the device with the door 10 is also referred to as an "internal device".

Figure 2:
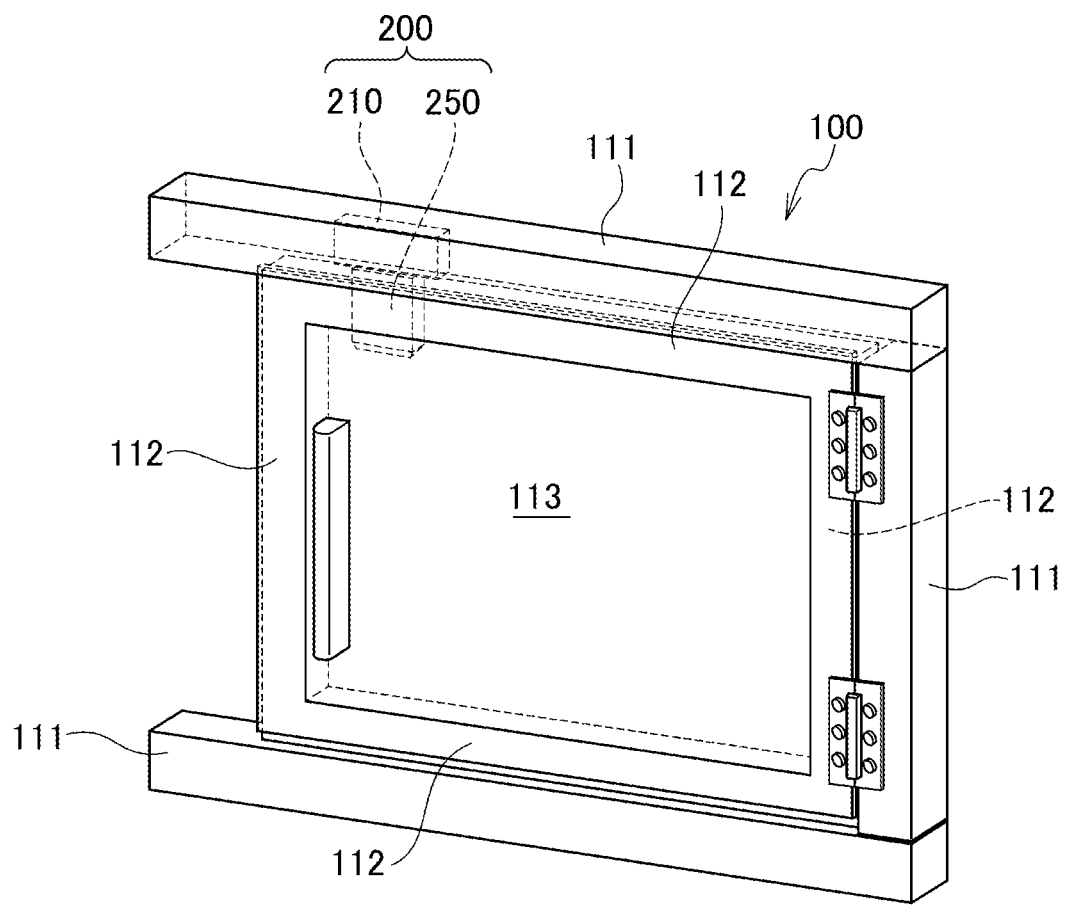
FIG. 2 is a perspective view illustrating a configuration example of a door.

FIG. 2 is a perspective view illustrating a configuration example of the door 100. The door 100 includes a fixed frame 111, a movable frame 112, and a door body 113, respectively.

The fixed frame 111 may be a part of a member that covers an outer periphery of the device with the door 10. The fixed frame 111 is, for example, an aluminum frame, and may be a frame made of another material. The fixed frame 111 does not have translucency.

The movable frame 112 is freely movable with respect to the fixed frame 111. As a result, the door 100 can be freely opened and closed. The movable frame 112 is, for example, an aluminum frame, and may be a frame made of another material. The movable frame 112 does not have translucency.

A periphery of the door body 113 is surrounded by the movable frame 112. For example, the door body 113 is formed of a translucent member. The translucent member may be formed of, for example, transparent plastic and glass, and the same also applies to a subsequent description of the translucent member.

An opening and closing system of the door 100 may include a hinged door system, a sliding door system, a folding door system, a bellows system, a double door system, a gull wing system, or the like.

The safety switch 200 functions as a door sensor for detecting opening and closing of the door 100. The safety switch 200 can detect the opening and closing of the door 100 (an own door) on which the safety switch 200 is mounted, and can also detect opening and closing of the door 100 (another door) other than the door on which the safety switch 200 is mounted. The safety switch 200 may have an interlock function, an external device monitoring (EDM) function, or the like.

The safety switch 200 includes a sensor body 210 and an actuator 250. The sensor body 210 is installed on the fixed frame 111 inside the device with the door 10. The actuator 250 is installed on the movable frame 112 inside the device with the door 10. Accordingly, when viewed from a confirmer who performs confirmation from the outside of the device with the door 10, the safety switch 200 is located on a back side of the fixed frame 111 and the movable frame 112. The confirmer can confirm a display of the safety switch 200 through the door body 113 which is formed of the translucent member.

A plurality of safety switches 200 can be connected to each other by any connection method. For example, a plurality of safety switches 200 can be connected to each other in series and cascade-connected to each other. Here, the order (a position) of series connection may be described by a stage. For example, the first safety switch 200 of the series connection may be defined as the safety switch 200 at a first front stage, and the last safety switch 200 of the series connection may be defined as the safety switch 200 at a last rear stage. The safety switch 200 at the last rear stage is connected to the safety programmable logic controller (PLC). The safety PLC instructs control of an operation of the internal device according to a detection result of presence of abnormality by the safety switch 200.

Figure 3:
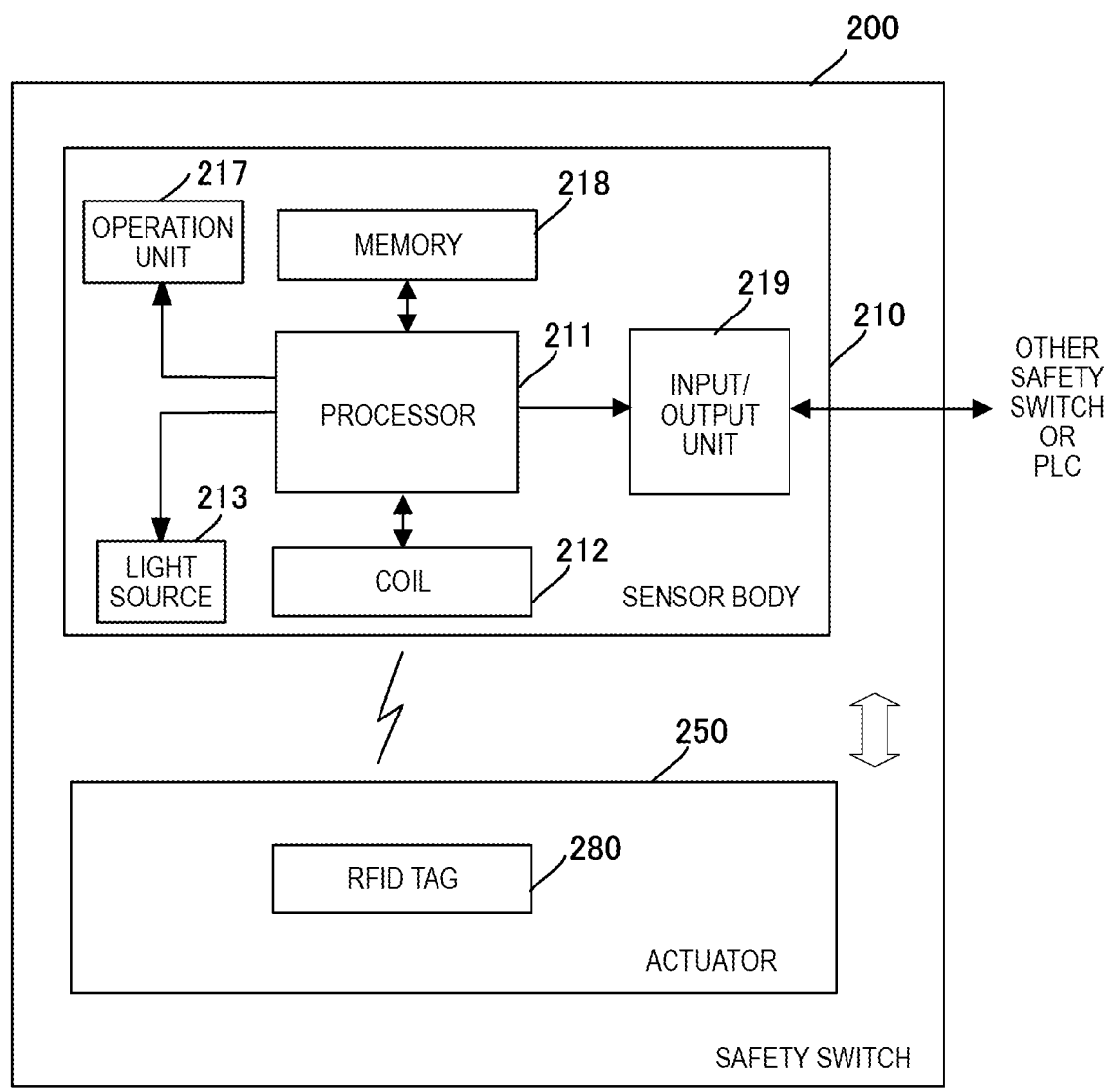
FIG. 3 is a block diagram illustrating a configuration example of a safety switch.

FIG. 3 is a block diagram illustrating a configuration example of the safety switch 200. The safety switch 200 includes the sensor body 210 and the actuator 250. The sensor body 210 includes a processor 211, a coil 212, a light source 213, an operation unit 217, a memory 218, and an input/output unit 219. The actuator 250 includes a radio frequency identifier (RFID) tag 280.

The processor 211 realizes various functions by cooperating with the memory 218 and executing a program stored in the memory 218. The processor 211 may include a micro processing unit (MPU), a central processing unit (CPU), a digital signal processor (DSP), or the like. The processor 211 controls an overall operation of the sensor body 210.

The processor 211 detects whether the own door is closed (in a closed state) or open (in an open state) based upon a state of proximity between the coil 212 of the sensor body 210 and the RFID tag 280 of the actuator 250.

The processor 211 sets any operation mode among a plurality of operation modes of the safety switch 200. The operation mode includes at least a pairing mode and a normal mode. The pairing mode is an operation mode in which the safety switch 200 (an own switch) is associated with the specific actuator 250. The normal mode is an operation mode in which the safety switch 200 detects the presence of abnormality in a normal operation.

The coil 212 receives power from the outside via the input/output unit 219, and transmits the power to an external device (for example, the actuator 250) by wireless power transmission. The wireless power transmission may be an electromagnetic induction method or a magnetic field resonance method. When the coil 212 receives a predetermined signal from the external device, the coil 212 notifies the processor 211 that the predetermined signal is received. The external device is, for example, the actuator 250, and more specifically the RFID tag 280 of the actuator 250. The coil 212 detects the closed state of the door 100 (an example of the absence of abnormality) by receiving the predetermined signal from the actuator 250 (here, the actuator 250 set to be paired), and detects the open state (an example of the presence of abnormality) of the door 100 by not receiving the predetermined signal therefrom.

There may be one light source or a plurality of light sources 213. The light source 213 emits (displays) light under the control of the processor 211. The light source 213 may project light to the actuator 250 via a light projecting port 214 which is not illustrated of the sensor body 210 facing the actuator 250. The actuator 250 may receive the emitted light, may guide the light from the sensor body 210 via, for example, the light guide unit 270 formed of a translucent member, and may emit visible light. The light source 213 may directly emit light to the outside of the safety switch 200 without projecting the light to the actuator 250. In any case, the present invention is not limited thereto as long as the light emitted by the safety switch 200 can be confirmed from the outside of the device with the door 10 through the door body 113 formed of the translucent member.

The light source 213 may be displayed based upon the operation mode. For example, when the operation mode is in the pairing mode, the light source 213 may display information on the pairing process. The information on the pairing process includes information indicating that the pairing process is in progress, information indicating a type of pairing process (for example, the initial setting process or the resetting process), or the like. The information on the pairing process includes information indicating that the actuator is detected in the pairing process, information indicating that the setting of the pairing is performed with a specific actuator, information indicating that the pairing process is completed, or the like.

For example, when the operation mode is in the normal mode, the light source 213 may be displayed based upon a detection result of presence of abnormality of the door 100 (the own door) by the safety switch 200 (the own switch). The light source 213 may be displayed based upon a detection result of presence of abnormality of another door 100 (another door) by another safety switch 200 (another switch) different from the above-described safety switch 200. The presence of the abnormality of the door 100 may include the open and closed state of the door 100. The light source 213 can be displayed in various display modes. The display mode may be a display color, a display pattern (for example, lighting, flashing, turning off light), light intensity, or the like.

The operation unit 217 includes, for example, various buttons, a key, a switch, or a component used for other operations. The operation unit 217 may include a mode selection key for selecting the operation mode. For example, the pairing process is started by selecting the pairing mode via the mode selection key. The operation unit 217 may include various operation units for inputting information necessary for the resetting process as the pairing process.

The memory 218 includes a primary storage device (for example, a random access memory (RAM) and a read only memory (ROM)). The memory 218 may include another storage device (for example, an SD card). The memory 218 stores various data, information, programs, or the like. The memory 218 stores, for example, an ID of the actuator 250 set to be paired (for example, an ID of the RFID tag 280). When the actuator 250 to be paired with the sensor body 210 is not set, the memory 218 does not include the ID of the actuator 250.

The input/output unit 219 inputs and outputs data, information, and a signal to and from an external device (for example, another switch, the safety PLC). Various signal lines are connected to the input/output unit 219. For example, the signal line is connected to another safety switch 200 and the safety PLC.

The RFID tag 280 of the actuator 250 is located within a communicable range with the coil 212 of the sensor body 210 when the door 100 is in the closed state. For example, the RFID tag 280 is disposed on a facing surface side facing the sensor body 210 in the actuator 250 when the door 100 is in the closed state. The RFID tag 280 transmits a predetermined signal. The RFID tag 280 is, for example, a passive tag, and operates by receiving power supply from the outside (for example, the sensor body 210). For example, the RFID tag 280 receives the power supply from the sensor body 210 via the coil 212 and transmits the predetermined signal to the sensor body 210. The predetermined signal may include at least the ID of the actuator 250 (for example, the ID of the RFID tag 280).

Here, specifically, a detection method by the safety switch 200 will be described.

The sensor body 210 detects the actuator 250 when the actuator 250 is disposed at a predetermined position with respect to the sensor body 210. Specifically, when the RFID tag 280 of the actuator 250 is positioned within an area where wireless power transmission from the coil 212 of the sensor body 210 can be performed, the sensor body 210 supplies power to the actuator 250, and the actuator 250 transmits a predetermined signal (a signal including the ID of the actuator 250) to the sensor body 210. When detecting that the predetermined signal is received from the actuator 250, the coil 212 notifies the processor 211 of the ID of the actuator 250. By receiving the notification, the processor 211 recognizes the actuator 250.

When the ID of the actuator 250 stored in the memory 218 matches the ID of the actuator 250 notified from the coil 212, the processor 211 recognizes that the actuator 250 is set to be paired. Here, the processor 211 detects that there exists no abnormality (for example, the door 100 is in the closed state). On the other hand, when the memory 218 does not store the ID of the actuator 250, or when the ID of the actuator 250 stored in the memory 218 does not match the ID of the actuator 250 notified from the coil 212, the processor 211 recognizes that the actuator 250 is not set to be paired. Here, the processor 211 detects that there exists abnormality (for example, the door 100 is in the open state).

In a state where the sensor body 210 and the actuator 250 are disposed at a predetermined position in the door 100 as illustrated in FIGS. 1 and 2, when the sensor body 210 detects the actuator 250 set to be paired, the processor 211 determines that the movable frame 112 on which the actuator 250 set to be paired is installed faces the fixed frame 111 on which the sensor body 210 is installed in a predetermined state, and the door 100 is in the closed state. When the sensor body 210 does not detect the actuator 250 set to be paired, the processor 211 determines that the movable frame 112 on which the actuator 250 set to be paired is installed does not face the fixed frame 111 on which the sensor body 210 is installed in the predetermined state, and the door 100 is in the open state.

Next, the pairing process will be described in detail.

For example, in the initial setting process, in a factory or the like, an operator who operates to perform the initial setting process simply grips the sensor body 210 and the actuator 250 and allows the sensor body 210 and the actuator 250 to approach each other, such that the sensor body 210 and the actuator 250 can be set to be paired. In the resetting process, at a base of the user or the like, the sensor body 210 and the actuator 250 approach each other in a state where the desired sensor body 210 and actuator 250 are installed on the door 100, the sensor body 210 and the actuator 250 can be set to be paired. In the resetting process as well, in the same manner as that of the initial setting process, the user may simply grip the sensor body 210 and the actuator 250 and may allow the sensor body 210 and the actuator 250 to approach each other, such that the sensor body 210 and the actuator 250 may be set to be paired.

Figure 4:
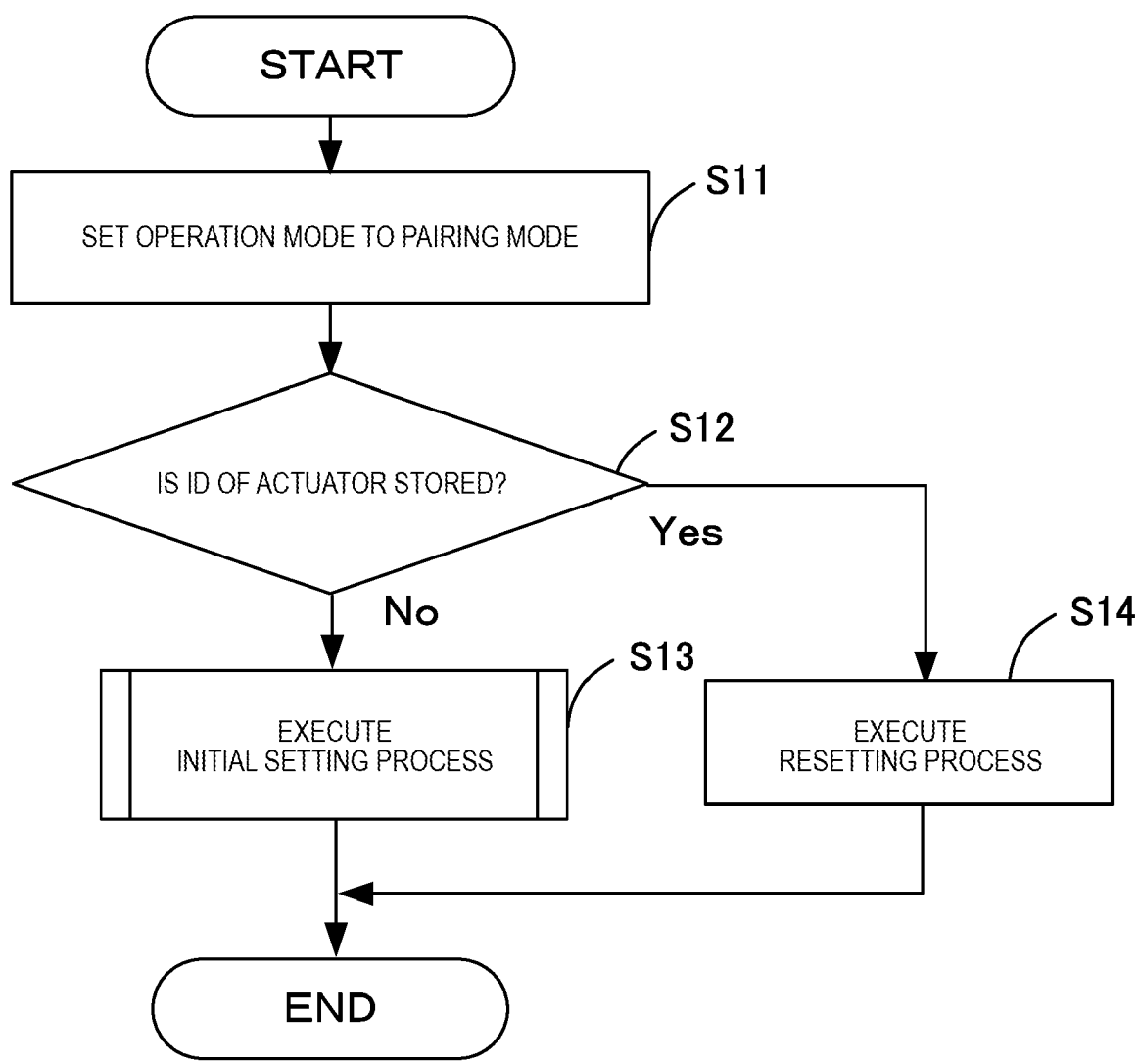
FIG. 4 is a flowchart illustrating an operation example of the safety switch.
Figure 5:
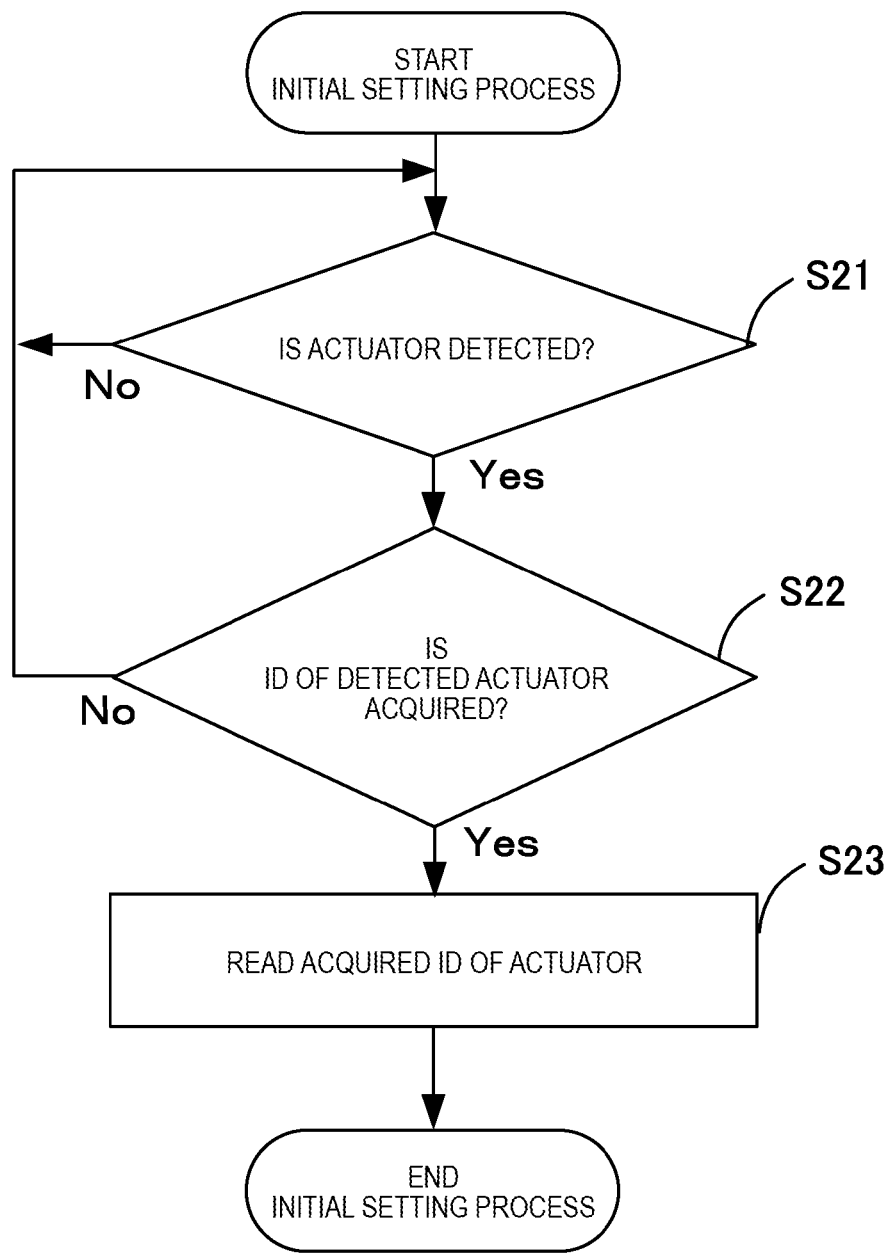
FIG. 5 is a flowchart illustrating an example of an initial setting process.

FIG. 4 is a flowchart illustrating an operation example of the safety switch 200. FIG. 5 is a flowchart illustrating an example of the initial setting process. In FIGS. 4 and 5, it is assumed that a body of the safety switch 200 is set to be paired with an actuator 250A which is one of the actuators 250.

First, for example, the processor 211 of the sensor body 210 sets the operation mode to the pairing mode via the operation unit 217 (S11). The processor 211 refers to the memory 218 and determines whether the ID of any actuator 250 (for example, the ID of the RFID tag 280) is already stored in the memory 218 (S12).

When the ID of the actuator 250 is not stored in the memory 218, it indicates that the sensor body 210 is not set to be paired yet, and the actuator 250 to be paired does not exist. Here, the processor 211 performs the initial setting process (S13).

When the ID of the actuator 250 is already stored in the memory 218, it indicates that the pairing process is already performed and the actuator 250 set to be paired exists. Here, the processor 211 performs a predetermined resetting process (S14).

When the initial setting process of S13 or the resetting process of S14 is completed, the processor 211 ends the pairing mode and ends the process of FIG. 4.

In the initial setting process, when the ID of the actuator 250 is not stored in the memory 218, the processor 211 determines whether the actuator 250 is detected via the coil 212 (S21). When the actuator is not detected, the process of S21 is repeated.

For example, when the actuator 250A as the actuator 250 is detected, the processor 211 attempts to acquire the ID stored in the actuator 250A (for example, the ID of the RFID tag 280) via the coil 212. The processor 211 determines whether the acquisition of the ID stored in the actuator 250A is completed (S22). When the acquisition of the ID stored in the actuator 250A is not completed, or when the acquisition thereof was not completed, the process proceeds to the process of S21, and wait for the detection of any actuator 250 again.

When the acquisition of the ID stored in the actuator 250A is completed, the processor 211 writes (stores) the ID of the actuator 250A, the acquisition of which is completed, in the memory 218 (S23).

Therefore, the ID of the actuator 250A is written therein in S23, such that the ID of the actuator 250A detected by the sensor body 210 and the ID of the actuator 250 stored in the memory 128 of the sensor body 210 become the same ID. The same ID becomes information indicating pairing (pairing information). The sensor body 210 and the actuator 250 storing the same ID become paired. After the end of S23, the initial setting process of FIG. 5 ends.

In the resetting process of S14 in FIG. 4, it may be required that the sensor body 21 detects the actuator 250 for a predetermined time, and does not detect the actuator 250 for a predetermined time. In the resetting process, it may be required to repeat a detection state and a non-detection state of the actuator 250 by the sensor body 210, and to make sustainable time of each detection state and sustainable time of each non-detection state different. As described above, a complicated procedure is performed in the resetting process.

In the resetting process, the sensor body 210 may overwrite the ID of the actuator 250 which is already stored with, for example, an ID of an actuator 250B as another actuator 250, and may newly store the ID of the actuator 250B in the memory 218. When a failure or the like occur in either one of the sensor body 210 and the actuator 250 that are set to be paired by performing the resetting process, the safety switch 200 is not required to replace both the sensor body 210 and the actuator 250, such that cost at the time of replacement can be reduced.

According to the operation examples illustrated in FIGS. 4 and 5 as described above, in the initial setting process, the desired sensor body 210 to be paired and the desired actuator 250 to be paired may approach each other, and the sensor body 210 may simply recognize the actuator 250. That is, when the ID of any actuator is not stored in the memory 168, the safety switch 200 stores the ID of the detected actuator 250 as it is, such that the sensor body 210 and the actuator 250 share the same ID, and are set to be paired. Therefore, the safety switch 200 can be set to be paired without requiring a complicated procedure in the initial setting process. Here as well, since the initial setting process is performed in a factory or the like, it is possible to avoid execution of an unintended pairing process and to prevent deterioration in reliability of the pairing process. The safety switch 200 can easily determine which type of pairing process (the initial setting process or the resetting process) is to be performed, depending on whether the ID of the actuator 250 is stored in the memory 218.

After the end of the process in FIG. 4, for example, the actuator 250 set to be paired with the sensor body 210 is installed at a predetermined position on the door 100 so that the actuator 250 is detected by the sensor body 210 when the door 100 is in the closed state, and is not detected by the sensor body 210 when the door 100 is in the open state. The actuator 250 is the actuator 250A or the actuator 250B. Next, in a state where the actuator 250 set to be paired is installed at the predetermined position, the processor 211 performs a process in the normal mode (a normal process) (for example, detection of opening and closing of the door 100).

The resetting process of S14 may be omitted. Here, when the ID of the actuator 250 is already stored in the memory 218 in S12, the processor 211 may prohibit the memory 218 from storing (overwriting) the ID of any actuator 250. As a result, even though the sensor body 210 detects an actuator 250C that is not set to be paired, the pairing that is already set can be continuously performed such that the normal process can be performed. Even though the ID of another actuator 250 (for example, the actuator 250B) is attempted to be fraudulently registered, it is possible to avoid the setting of another pairing.

As such, in the initial setting process where it is hard to be presumed that a fraudulent operation is performed, even though the procedure for the pairing process is simplified, for example, it is hard to be presumed that the sensor body 210 and the actuator 250 that are not intended are fraudulently set to be paired. Accordingly, the safety switch 200 can maintain high reliability of the pairing of the sensor body 210 and the actuator 250 even when the initial setting process is performed. Even though the safety switch 200, on which the initial setting process is performed, is installed on the door 100 and the normal operation is performed, in the combination of the sensor body 210 and the actuator 250 that are not set to be paired, the presence of abnormality is detected. Here, for example, the operation of the internal device can be stopped by an instruction of the safety PLC.

While various embodiments are described above with reference to the drawings, it goes without saying that the present invention is not limited to such examples. It is apparent that a person skilled in the art can come up with various modifications or corrections within the scope of the claims, and it is understood that the modifications or corrections naturally belong to the technical scope of the present invention. Respective components in the embodiments may be selectively combined with each other within the scope not departing from the gist of the invention.

In the embodiment, it is shown as an example that the device with the door 10 surrounds the internal device by the door 100, but the present invention is not limited thereto. For example, a locker (for example, a home delivery locker) may be disposed instead of the internal device. The door 100 may simply surround a predetermined space. That is, the device with the door 10 may simply partition the space.

In the embodiment, it is shown as an example that the safety switch 200 detects the open and closed state of the door 100 as the detection of the presence of abnormality, but the present invention is not limited thereto. Abnormality other than the open and closed state of the door 100 may be detected.

In the embodiment, it is shown as an example that the sensor body 210 is installed on the back side of the door 100, but the present invention is not limited thereto. The sensor body 210 may be installed on the front side of the door 100. While it is shown as an example that the door body 113 is formed of the translucent member, the door body 113 may be formed of a non-translucent member.

In the embodiment, the processor may be physically configured in various ways. When a programmable processor is used, a processing content can be changed by changing a program, such that a degree of freedom in a processor design can be improved. The processor may be configured with one semiconductor chip, or may be physically configured with a plurality of semiconductor chips. When the processor is configured with a plurality of semiconductor chips, each control of the embodiment may be realized by a different semiconductor chip, respectively. Here, it can be considered that one processor is configured with those plurality of semiconductor chips. The processor may be configured with a member (a capacitor or the like) having a function different from that of the semiconductor chip. One semiconductor chip may be configured to realize the function of the processor and other functions. A plurality of processors may be configured with one processor.

As described above, the safety switch 200 of the embodiment includes the sensor body 210. The sensor body 210 includes: a setting unit (for example, the processor 211) that sets the operation mode of the safety switch 200; a detection unit (for example, the coil 212) that detects the actuator 250; a storage unit (for example, the memory 218); and a control unit (for example, the processor 211) that controls storage operation of the storage unit for the identification information (for example, the ID) of the actuator 250. In response to satisfaction of conditions where: the operation mode is set by the setting unit to the pairing mode for associating the sensor body 210 and the actuator 250 with each other; the identification information of the actuator 250 is not stored in the storage unit; and the actuator 250A (an example of a first actuator) is detected by the detection unit, the control unit allows the detection unit to acquire the identification information of the actuator 250A and the storage unit to store the identification information of the first actuator.

As a result, when the identification information of the actuator 250 is not stored in the storage unit, the safety switch 200 can be simply adjusted so that the actuator 250A is detected by the sensor body 210 in the initial setting process, such that the sensor body 210 and the actuator 250 can share the same ID. The safety switch 200 can set the sensor body 210 and the actuator 250A that share the same ID to be paired. Accordingly, the safety switch 200 can perform the setting of the pairing without requiring a complicated procedure in the initial setting process. Here as well, since the initial setting process is performed in a factory or the like, it is possible to avoid the unintended pairing process and to prevent the deterioration in the reliability of the pairing process. Therefore, the safety switch 200 can prevent deterioration in reliability of the safety switch 200 while simplifying the initial association between the sensor body 210 and the actuator 250.

In response to satisfaction of conditions where: the operation mode is set by the setting unit to the pairing mode; the identification information of the actuator 250 is stored in the storage unit; and the identification information of the actuator 250C (an example of a second actuator) is detected by the detection unit, the control unit may prohibit the storage unit from storing the identification information of the actuator 250B.

As a result, when the identification information of the actuator 250 is already stored in the storage unit, the safety switch 200 includes the actuator 250 set to be paired with the sensor body 210. Here, the identification information of the detected actuator 250C is prohibited from being stored, thereby making it possible to continuously perform the pairing being set. Accordingly, for example, even though the actuator 250C is fraudulently detected by the sensor body 210, the safety switch 200 can prevent the actuator 250C from being set to be paired, and can prevent the actuator 250C from being fraudulently used.

In response to satisfaction of conditions where: the operation mode is set by the setting unit to the pairing mode; and the identification information of the actuator 250 is stored in the storage unit, the control unit may perform the resetting process for resetting the association between the sensor body 210 and another actuator 250 (for example, the actuator 250B) of which identification information is not stored in the storage unit of the sensor body 210.

As a result, the safety switch 200 can easily determine which type of pairing process (the initial setting process or the resetting process) is to be performed depending on whether the ID of the actuator 250 is stored in the memory 218.

The present disclosure is useful for a safety switch and a storage control method capable of preventing deterioration in reliability of the safety switch while simplifying an initial association between a sensor body and an actuator.

The invention claimed is:

1. A safety switch comprising:
   a sensor body,
   wherein the sensor body comprises:
      a setting unit configured to set an operation mode of the safety switch;
      a detection unit configured to detect a first actuator;
      a storage unit; and
      a control unit configured to control storage operation of the storage unit for identification information of the first actuator, and
   wherein in response to satisfaction of conditions where:

the operation mode is set by the setting unit to a pairing mode for associating the sensor body and the first actuator with each other;
the identification information of the first actuator is not stored in the storage unit; and
the first actuator is detected by the detection unit,
the control unit allows the detection unit to acquire identification information of the first actuator and the storage unit to store the identification information of the first actuator,
wherein in response to satisfaction of conditions where:
the operation mode is set by the setting unit to the pairing mode;
the identification information of the first actuator is stored in the storage unit; and
identification information of a second actuator is detected by the detection unit,
the control unit prohibits the storage unit from storing the identification information of the second actuator.

2. A storage control method for allowing the sensor body of the safety switch according to claim 1 and the first actuator to be in association with each other, the storage control method comprising:
setting an operation mode of the safety switch; and
acquiring, by the sensor body, identification information of the first actuator and storing the identification information of the first actuator in response to satisfaction of conditions where:
a pairing mode for associating the sensor body of the safety switch and the actuator with each other is set;
identification information of the first actuator is not stored in the sensor body; and
the first actuator is detected by the sensor body.

3. A safety switch comprising:
a sensor body,
wherein the sensor body comprises:
a setting unit configured to set an operation mode of the safety switch;
a detection unit configured to detect a first actuator;
a storage unit; and
a control unit configured to control storage operation of the storage unit for identification information of the first actuator, and
wherein in response to satisfaction of conditions where:
the operation mode is set by the setting unit to a pairing mode for associating the sensor body and the first actuator with each other;
the identification information of the first actuator is not stored in the storage unit; and
the first actuator is detected by the detection unit,
the control unit allows the detection unit to acquire identification information of the first actuator and the storage unit to store the identification information of the first actuator,
wherein in response to satisfaction of conditions where:
the operation mode is set by the setting unit to the pairing mode; and
the identification information of the first actuator is stored in the storage unit,
the control unit performs a resetting process in which the sensor body overwrites the identification information of the first actuator which is stored in the storage unit with an identification information of a third actuator, and stores the identification information of the third actuator in the storage unit.

* * * * *